US006516069B1

(12) United States Patent
Takeuchi et al.

(10) Patent No.: US 6,516,069 B1
(45) Date of Patent: Feb. 4, 2003

(54) MICROPHONE FILTER AND MICROPHONE UNIT

(75) Inventors: Takanobu Takeuchi, Tokyo (JP); Toru Araki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 247 days.

(21) Appl. No.: 09/610,430

(22) Filed: Jul. 5, 2000

(30) Foreign Application Priority Data

Feb. 25, 2000 (JP) ....................................... 2000-049709

(51) Int. Cl.[7] ............................ H04R 3/00; H03K 5/00; H03F 3/04

(52) U.S. Cl. ....................... 381/122; 381/111; 381/112; 381/113; 327/552; 327/559; 330/303; 330/288

(58) Field of Search ......................... 381/111–115, 191, 381/120, 122; 327/552, 559; 330/303, 288

(56) References Cited

U.S. PATENT DOCUMENTS 5,239,588 A * 8/1993 Davis ......................... 381/313
5,266,852 A * 11/1993 Shigenari et al. ........... 327/552
5,285,172 A * 2/1994 Okanobu et al. ........... 330/288
5,396,188 A * 3/1995 Aoki .......................... 327/552
5,579,397 A * 11/1996 Ikeda et al. ................. 381/113
5,825,251 A * 10/1998 Nakagawa .................. 330/297
6,178,249 B1 * 1/2001 Hietanen et al. ............ 367/181
6,194,959 B1 * 2/2001 Kamoshida et al. ........ 327/552
6,218,883 B1 * 4/2001 Takeuchi .................... 327/103

* cited by examiner

*Primary Examiner*—Minsun Oh Harvey
*Assistant Examiner*—Laura A. Grier
(74) *Attorney, Agent, or Firm*—Oblon, Spivak, McClelland, Maier & Neustadt, P.C.

(57) ABSTRACT

A large-time-constant microphone filter which contains resistance and capacitance as its constituent and can be formed in the same semiconductor chip as a microphone unit is achieved, which results in downsizing and cost reduction of the microphone unit. A transistor of a current mirror circuit is used as a resistance of a microphone filter, utilizing a differential resistance produced by a channel length modulation effect of the transistor or an Early effect. When variations in the drain-source voltage of the transistor occur, the drain-source current of the transistor slightly varies in linear characteristics and the transistor serves a high value of resistance. Being a current mirror circuit, the microphone filter is resistant to characteristic variations due to temperature changes and can be formed in a semiconductor chip without a significant increase in chip area.

8 Claims, 3 Drawing Sheets

*F/G. 4 (BACKGROUND ART)*
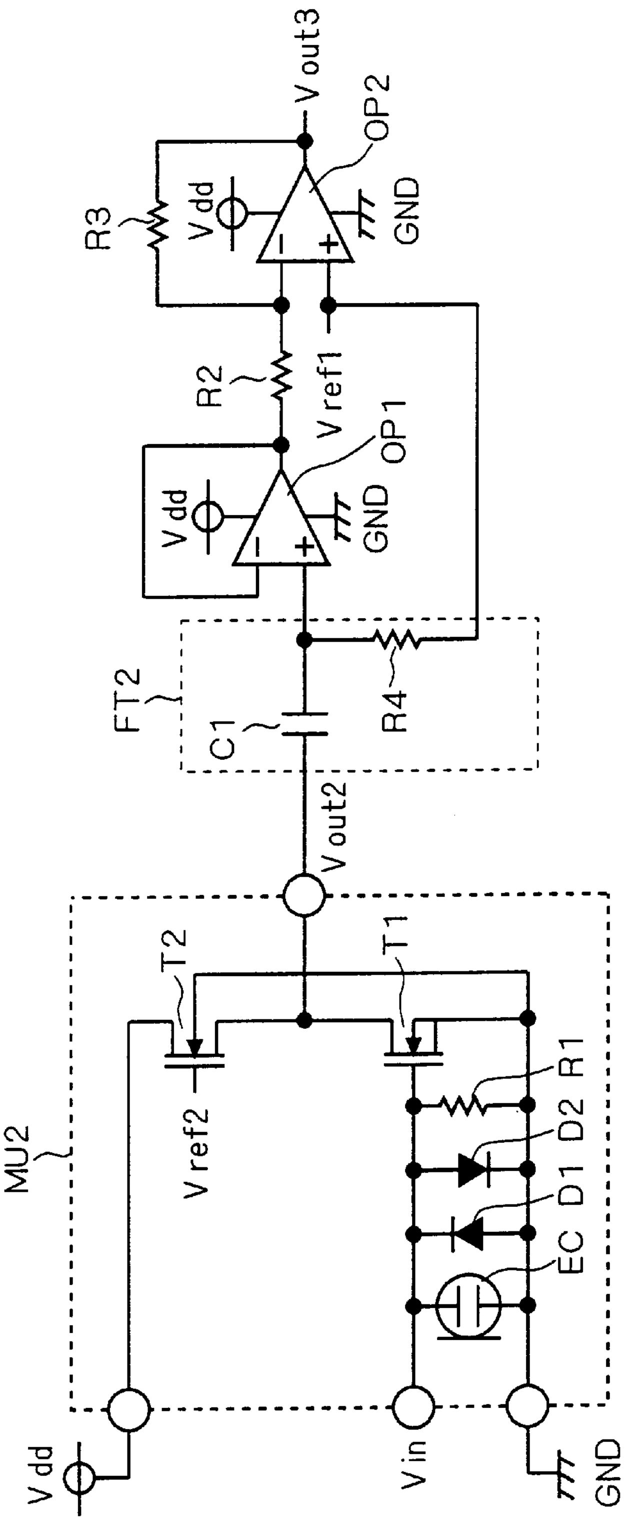

MICROPHONE FILTER AND MICROPHONE UNIT

BACKGROUND OF THE INVENTION

1. Field of the Invention

The present invention relates to a microphone unit which is formed in a semiconductor chip and comprises a pressure sensitive element such as an electret capacitor, and also to a microphone filter for removing direct-current (DC) components and low-frequency components unnecessary for a sound signal from an output signal from the microphone unit.

2. Description of the Background Art

A conventional microphone unit and microphone filter are shown in FIG. 4. FIG. 4 illustrates a microphone unit MU2 comprising an electret capacitor EC. Upon receipt of sound pressure, the electret capacitor EC varies its capacitance and generates an input signal Vin between its both electrodes. A ground potential GND is applied to one end of the electret capacitor EC. Then, an impedance converter comprised of diodes D1, D2, a resistance R1, and N-channel MOS transistors T1, T2 is connected across the electret capacitor EC. More specifically, the anode of the diode D1 is connected to one end of the electret capacitor EC and the cathode thereof to the other end of the electret capacitor EC. The diode D2 is connected across the electret capacitor EC with its anode and cathode connected in the reverse fashion for those of the diode D1. The resistance R1 is connected in parallel across the electret capacitor EC. The source of the transistor T1 is connected to one end of the electret capacitor EC and the gate thereof to the other end of the electret capacitor EC. The drain of the transistor T1 is connected to the source of the transistor T2. A power supply potential Vdd is applied to the drain of the transistor T2 and a predetermined potential Vref2 to the gate of the transistor T2. Further, the ground potential GND is applied to the back gates of the transistors T1 and T2.

When no input signal Vin is applied, the gate-source voltage of the transistor T1 is maintained at 0 V by the diodes D1, D2 and the resistance R1. Upon application of the input signal Vin, variations occur in the gate-source voltage of the transistor T1. This effects a change in the drain-source current. In the transistor T1 being of a depletion type, the current flows between the drain and source even if the gate-source voltage is 0 V. The variations in the drain-source current of the transistor T1 causes variations in the drain-source current of the transistor T2, thereby changing the gate-source voltage of the transistor T2. This potential change at the source of the transistor T2 becomes an output signal Vout2.

As shown in FIG. 4, a microphone filter FT2 is configured as a CR circuit composed of a capacitor C1 and a resistance R4. The capacitor C1 receives at its one end the output signal Vout2 from the microphone unit MU2 and is connected at its other end to one end of the resistance R4. Further, a predetermined potential Vref1 is applied to the other end of the resistance R4.

The microphone filter FT2 removes DC components and low-frequency components included in the output signal Vout2 by outputting a voltage dropped at the resistance R4. Since serving as a sound signal, the output signal Vout2 should have an audio-frequency region in the range of approximately 100 Hz to 20 kHz. Thus, DC and low-frequency components unnecessary for the sound signal are removed from the output signal Vout2.

The output from the microphone filter FT2 is fed into an amplifier. Illustrated in FIG. 4 is an amplifier including a voltage follower and an inverting amplifier. More specifically, the output from the microphone filter FT2 is fed into a positive input of an operational amplifier OP1. The operational amplifier OP1 receives its own output at its negative input, serving as a voltage follower. The output from the operational amplifier OP1 is then fed into a negative input of an operational amplifier OP2 through a resistance R2. Also, the operational amplifier OP2 receives its own output Vout3 at its negative input through a resistance R3, serving as an inverting amplifier. Here, a predetermined potential Vref1 is applied to the positive input of the operational amplifier OP2.

The microphone filter FT2 removes DC and low-frequency components from the output signal Vout2 at a cut-off frequency, $f=1/(2\pi CR)$, where C is the capacitance of the capacitor C1 and R is the resistance of the resistance R4. In order to remove low-frequency signals approximately below 100 Hz and DC components from the output signal Vout2, the product of the capacitance C and the resistance R, i.e., time constant, must be large; for example, such a combination as the capacitance of 1 $\mu$F and the resistance of 1.6 kΩ or the capacitance of 100 pF and the resistance of 16 MΩ becomes necessary. Forming such high capacitance and resistance in combination in a single semiconductor chip increases chip area, preventing downsizing and cost reduction of semiconductor chips. For this reason, the conventional microphone filter FT2 cannot fit in a semiconductor chip in which the microphone unit MU2 is formed, and other discrete parts such as a capacitor and a resistance are required to form the filter.

Even with the use of discrete parts such as a capacitor and a resistance, it is difficult to achieve downsizing and cost reduction because of a high cost of such parts, an increase in processing steps, and the impossibility of housing the microphone filter in the semiconductor chip in which the microphone unit is formed. Incidentally, the amplifier is not fitted into the same semiconductor chip as the microphone unit is formed.

SUMMARY OF THE INVENTION

A first aspect of the present invention is directed to a microphone filter comprising: a capacitor having one end, and the other end to which an output from a microphone is fed; a first transistor having a first current electrode which is connected to the one end of the capacitor, a second current electrode to which a first fixed potential is applied, and a control electrode; a second transistor having a first current electrode, a second current electrode which is connected to the second current electrode of the first transistor, and a control electrode which is connected to the control electrode of the first transistor; and a constant current source connected to the first current electrode and the control electrode of the second transistor.

A second aspect of the present invention is directed to a microphone unit comprising: a microphone formed in a semiconductor chip; and a microphone filter of the first aspect, which is formed in the semiconductor chip, wherein an output from the microphone is fed into the other end of the capacitor.

According to a third aspect of the present invention, the microphone unit of the second aspect further comprises: an amplifier formed in the semiconductor chip and having an input which is connected to the first current electrode of the first transistor of the microphone filter.

A fourth aspect of the present invention is directed to a microphone unit comprising: a microphone formed in a semiconductor chip; and an amplifier formed in the semiconductor chip and having an input into which an output from the microphone is fed.

The microphone filter of the first aspect can utilize, as its resistance, a differential resistance which is produced by a channel length modulation effect or an Early effect of the voltage-current characteristics between the first and second current electrodes of the first transistor. This achieves a large-time-constant microphone filter containing resistance and capacitance as its constituents. Since the first and second transistors and the constant current source form a current mirror circuit, the microphone filter is resistant to variations in the voltage-current characteristics of the first transistor due to temperature changes, and can be formed in a semiconductor chip without a significant increase in chip area.

In accordance with the second aspect, the microphone filter of the first aspect and the microphone can be formed in the same semiconductor chip. This achieves downsizing and cost reduction of the microphone unit.

The microphone unit of the third aspect further comprises the amplifier. This achieves further downsizing and cost reduction of the microphone unit.

In accordance with the fourth aspect, the amplifier and the microphone can be formed in the same semiconductor chip. This achieves downsizing and cost reduction of the microphone unit.

An object of the present invention is to achieve a large-time-constant microphone filter which contains resistance and capacitance as its constituents and can be formed in the same semiconductor chip as the microphone unit, thereby ensuring downsizing and cost reduction of the microphone unit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 shows a conventional microphone unit and microphone filter.

DESCRIPTION OF THE PREFERRED EMBODIMENTS

Figure 1:
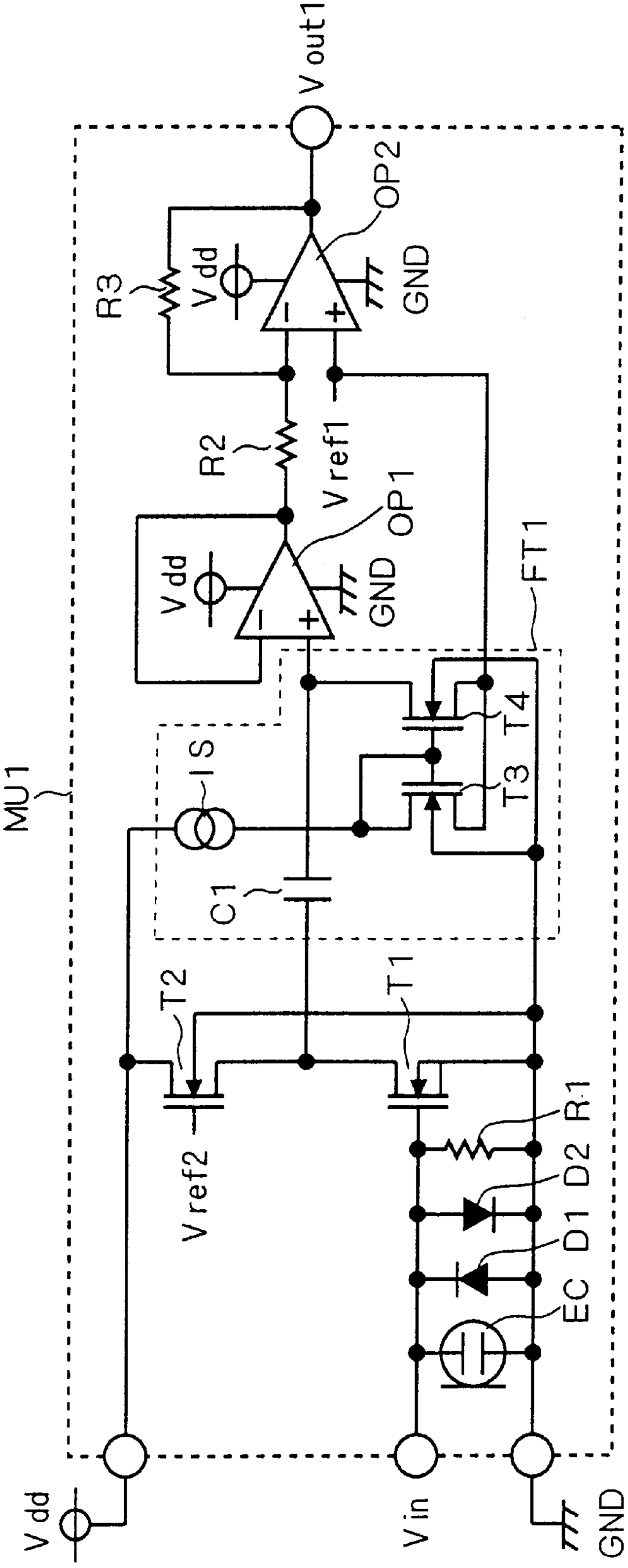
FIG. 1 shows a microphone unit according to a preferred embodiment of the present invention.

FIG. 1 shows a microphone unit MUl according to a preferred embodiment of the present invention. Like the microphone unit MU2 in FIG. 4, the microphone unit MU1 in FIG. 1 also comprises an electret capacitor EC by way of example. More specifically, a ground potential GND is applied to one end of the electret capacitor EC. Upon receipt of sound pressure, the electret capacitor EC varies its capacitance and generates an input signal Vin between its both electrodes. The anode of the diode D1 is connected to one end of the electret capacitor EC and the cathode thereof to the other end of the electret capacitor EC. The diode D2 is connected across the electret capacitor EC with its anode and cathode connected in the reverse fashion for those of the diode D1. The resistance R1 is connected in parallel across the electret capacitor EC. The source of the transistor T1 is connected to the one end of the electret capacitor EC and the gate thereof to the other end of the electret capacitor EC. The drain of the transistor T1 is connected to the source of the transistor T2. A power supply potential Vdd is applied to the drain of the transistor T2 and a predetermined potential Vref2 to the gate of the transistor T2. Further, the ground potential GND is applied to the back gates of the transistors T1 and T2.

The operations of the electret capacitor EC and of an impedance converter comprised of the diodes D1, D2, the resistance R1, and the transistors T1, T2 are identical to those in the microphone unit MU2 and thus omitted from the description.

The microphone unit MU1 according to the preferred embodiment of the present invention is formed in a semiconductor chip, in which a microphone filter FT1 and an amplifier are further formed.

The microphone filter FT1 is basically a CR circuit which is identical to the conventional microphone filter FT2, but it uses, as its resistance, a transistor of a current mirror circuit. That is, the microphone filter FT1 comprises a capacitor C1, N-channel MOS transistors T3, T4, and a constant current source IS with the transistors T3, T4 and the constant current source IS forming a current mirror circuit. The capacitor C1 receives at its one end an output signal at the source of the transistor T2. The other end of the capacitor C1 is connected to the drain of the transistor T4. Further, a predetermined potential Vref1 is applied to the source of the transistor T4. The source of the transistor T3 is connected to the source of the transistor T4 and the gate thereof is connected to the gate of the transistor T4. The drain of the transistor T3 is connected to one end of the constant current source IS and further short-circuited with the gate of the transistor T4. A power supply potential Vdd is applied to the other end of the constant current source IS. Further, the ground potential GND is applied to the back gates of the transistors T3 and T4.

The microphone filter FT1 removes DC components and low-frequency components included in the output signal at the source of the transistor T2 by outputting a voltage dropped between the drain and source of the transistor T4.

The output from the microphone filter FT1 is fed into the amplifier. Illustrated in FIG. 1 is an amplifier including a voltage follower and an inverting amplifier as in FIG. 4. More specifically, the output from the microphone filter FT1 is fed into a positive input of an operational amplifier OP1. The operational amplifier OP1 receives its own output at its negative input, serving as a voltage follower. The output from the operational amplifier OP1 is then fed into a negative input of an operational amplifier OP2 through a resistance R2. Also, the operational amplifier OP2 receives its own output Vout1 at its negative input through a resistance R3, serving as an inverting amplifier. Here, the predetermined potential Vref1 is applied to the positive input of the operational amplifier OP2.

Now, we will describe the reason why the transistor of the current mirror circuit is used as a resistance in the microphone filter FT1.

Figure 2:
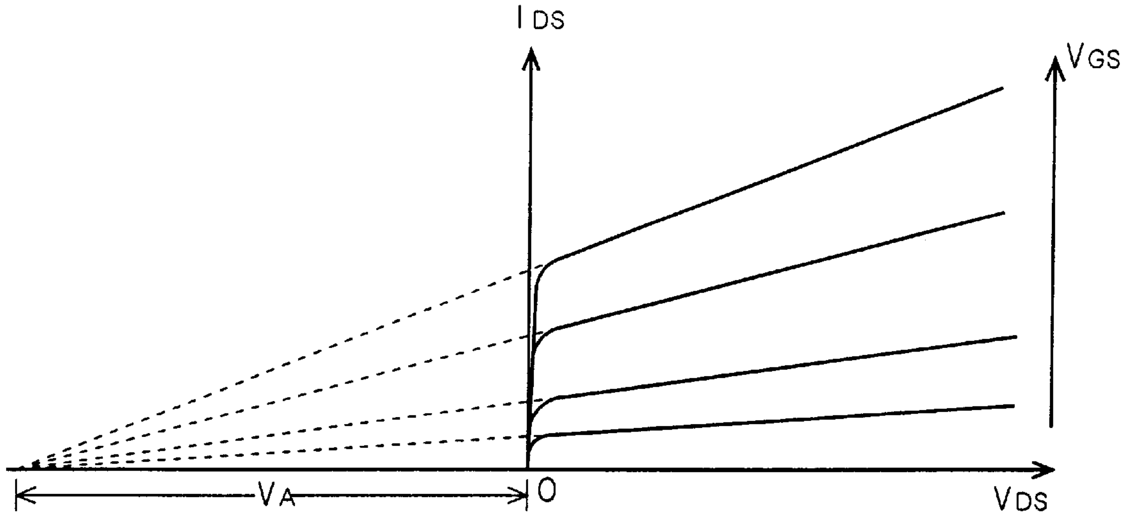
FIG. 2 is an explanatory diagram of a channel length modulation effect and an Early voltage.

For MOS transistors, for example, a relationship between the drain-source current $I_{DS}$ and the drain-source voltage $V_{DS}$, i.e., the voltage-current characteristic, is generally such that there are two separate regions: a resistance region where the drain-source current $I_{DS}$ increases with the increase of the drain-source voltage $V_{DS}$ and a constant current region where the drain-source current $I_{DS}$ does not increase beyond a predetermined value even with the increase of the drain-source voltage $V_{DS}$. In practice, however, the phenomenon in which the drain-source current $I_{DS}$ slightly increases with the increase of the drain-source voltage $V_{DS}$ is noted in the constant current region as shown in FIG. 2. This phenomenon is considered to be produced by effective channel length modulation due to a depletion region generated at the drain, and is thus called a channel length modulation effect. This channel length modulation effect can be expressed by the following equations:

$$I_{DS} = \frac{\beta}{2}(V_{GS} - V_T)^2(1 + \lambda V_{DS}) \tag{1}$$

$$\beta = \frac{\mu C_{OX} W}{L} \tag{2}$$

where $V_{GS}$ is the gate-source voltage of an MOS transistor, $V_T$ is the threshold voltage of the MOS transistor, $\lambda$ is the channel length modulation parameter, $\beta$ is the gain constant, W is the channel width, L is the channel length, $\mu$ is the carrier mobility on the channel surface, and $C_{OX}$ is the capacitance of a gate insulator per unit area.

As shown in FIG. 2, it is known that, if each voltage-current characteristic in the constant current region in view of the channel length modulation effect is extrapolated toward the $V_{DS}$ axis, they converge at a single point of intersection. The absolute value of voltage to this point of intersection is called an Early voltage $V_A$, which is approximately in the range of 50 to 100 V for transistors on an integrated circuit.

From a different perspective, this channel length modulation effect can be taken as a phenomenon in which only slight changes in the drain-source current $I_{DS}$ effect profound changes in the drain-source voltage $V_{DS}$. That is, the MOS transistor in the constant current region can be considered as having a high value of resistance (differential resistance).

By utilizing this fact, it becomes possible to provide a high value of resistance on a semiconductor chip without the use of discrete parts. With high resistance, there is no need to have a large capacitance in the microphone filter FT1. This is the reason why the transistor is used as a resistance in the microphone filter FT1.

If only a predetermined gate-source voltage is applied to a single MOS transistor and the drain-source at that time is used as a resistance, some problems can arise. For example, it is conceivable that variations in the voltage-current characteristics due to temperature changes will cause variations in resistance in the microphone filter FT1. In such a case, the value of the cut-off frequency f is greatly affected, so the function of the microphone filter as a sound signal filter can be impaired.

For this reason, the transistor of the current mirror circuit is used as a resistance in the microphone filter FT1. The current mirror circuit is resistant to characteristic variations due to temperature changes and can be formed in a semiconductor chip without a significant increase in chip area.

In the microphone filter FT1, a constant current of the same value as the output current from the constant current source IS flows both between the source and drain of the transistor T3 and between those of the transistor T4. In the presence of the channel length modulation effect as above described, when variations in the drain-source voltage $V_{DS}$ of the transistor T4 occur, the drain-source current $I_{DS}$ of the transistor T4 slightly varies in linear characteristic. That is, the transistor T4 serves as a high value of resistance.

As can be seen from the voltage-current characteristics in FIG. 2, the lower the gate-source voltage $V_{GS}$ (i.e., the lower the drain-source current $I_{DS}$ in the constant current region), the less the channel length modulation effect and the resistance (differential resistance in the constant current region) approaches infinity. In order to increase the resistance, the output current from the constant current source IS should be reduced to keep the drain-source current $I_{DS}$ of the transistor T4 small, so that variations in the drain-source current $I_{DS}$ of the transistor T4 relative to variations in the drain-source voltage $V_{DS}$ becomes small.

Figure 3:
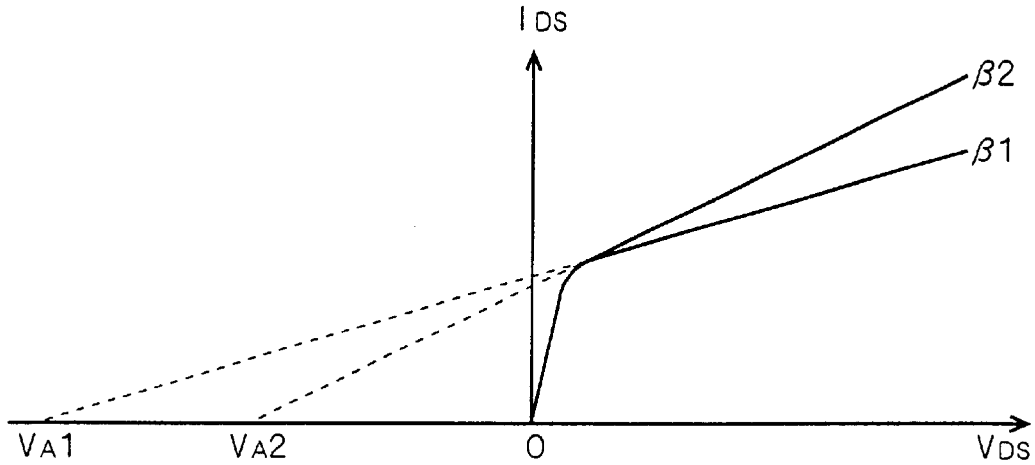
FIG. 3 is an explanatory diagram of a relationship between the gain constant and the Early voltage.

The channel length modulation effect can also be lessened by increasing the value of the gain constant $\beta$ in Equation (2). This is because the value of the Early voltage $V_A$ differs depending on the value of the gain constant $\beta$ as shown in FIG. 3. In FIG. 3, $\beta 1 > \beta 2$ and $V_A 1 > V_A 2$. In order to increase the resistance, the value of the gain constant $\beta$ should be increased. For this increase, as can be seen from Equation (2), the channel length L of the transistor T4 should be reduced or the channel width W thereof should be increased in design. Of course, these transistor sizes are determined by performing simulations in consideration of chip area and other elements or manufacturing and evaluating prototypes.

While the channel length modulation effect of MOS transistors is utilized in this preferred embodiment, the same effect can also be obtained by utilizing an Early effect of bipolar transistors. When bipolar transistors are used as the transistors T3 and T4, the gate, the drain, and the source in the above description should be replaced by a base, a collector, and an emitter, respectively.

Further, while the microphone unit of this preferred embodiment has been described as comprising the electret capacitor, other configurations of microphone units that can be formed in a semiconductor chip are also applicable to the present invention. Such an example includes a piezoelectric microphone unit formed in a semiconductor chip.

With the microphone unit MU1 according to the preferred embodiment of the present invention, a differential resistance produced by the channel length modulation effect of the voltage-current characteristics between the drain and source of the transistor T4 can be employed as a resistance. This achieves a large-time-constant microphone filter containing resistance and capacitance as its constituents. Since the transistors T3, T4 and the constant current source IS form a current mirror circuit, the microphone filter is resistant to variations in voltage-current characteristics of the transistor T4 due to temperature changes and can be formed in a semiconductor chip without a significant increase in chip area.

Further, the microphone filter and the microphone unit can be formed in the same semiconductor chip. This achieves downsizing and cost reduction of the microphone unit.

Furthermore, the amplifier can also be formed in the same semiconductor chip. This achieves further downsizing and cost reduction of the microphone unit.

While the invention has been shown and described in detail, the foregoing description is in all aspects illustrative and not restrictive. It is therefore understood that numerous modifications and variations can be devised without departing from the scope of the invention.

What is claimed is:

1. A microphone filter comprising:

a capacitor having a first end, and a second end into which an output from a microphone is fed;

a first transistor having a first current electrode connected to said first end of said capacitor, a second current electrode to which a first fixed potentials applied, and a control electrode, a second transistor having a first current electrode, a second current electrode which is connected to said second current electrode of said first transistor, and a control electrode which is connected to said control electrode of said first transistor; and a constant current source connected to said first current electrode and said control electrode of said second transistor such that a constant current of a same value as an output current from the constant current source flows both between the first and second current electrodes of the second transistor and between the first and second current electrodes of the first transistor thereby forming a current mirror circuit.

2. A microphone unit comprising:

a microphone formed in a semiconductor chip; and a microphone filter formed in said semiconductor chip, said microphone filter including, a capacitor having a first end, and a second end into which an output from the microphone is fed, a first transistor having a first current electrode connected to said first end of said capacitor, a second current electrode to which a first fixed potentials applied, and a control electrode, a second transistor having a first current electrode, a second current electrode which is connected to said second current electrode of said first transistor, and a control electrode which is connected to said control electrode of said first transistor, and a constant current source connected to said first current electrode and said control electrode of said second transistor such that a constant current of a same value as an output current from the constant current source flows both between the first and second current electrodes of the second transistor and between the first and second current electrodes of the first transistor thereby forming a current mirror circuit, wherein an output from said microphone is fed into said second end of said capacitor.

3. The microphone unit according to claim 2, wherein said microphone includes:

an electret capacitor having a first end, and a second end to which a second fixed potential is applied;

a third transistor having a first current electrode, a second current electrode which is connected to said second end of said electret capacitor, and a control electrode which is connected to said first end of said electret capacitor; and a current source connected to said first current electrode of said third transistor.

4. The microphone unit according to claim 3, wherein said microphone further includes:

a first diode having a cathode which is connected to said one end of said electret capacitor and an anode which is connected to said other end of said electret capacitor;

a second diode having an anode which is connected to said one end of said electret capacitor and a cathode which is connected to said other end of said electret capacitor; and a resistance connected in parallel with said electret capacitor.

5. The microphone unit according to claim 3, wherein said current source in said microphone is a fourth transistor having a first current electrode to which a third fixed potential is applied, a second current electrode which is connected to said first current electrode of said third transistor, and a control electrode to which a fourth fixed potential is applied.

6. The microphone unit according to claim 2, further comprising:

an amplifier formed in said semiconductor chip and having an input which is connected to said first current electrode of said first transistor of said microphone filter.

7. The microphone unit according to claim 6, wherein said amplifier includes:

a first resistance having a first end which is connected to said first current electrode of said first transistor, and a second end;

a first operational amplifier having a negative input which is connected to said second end of said first resistance, a positive input to which a second fixed potential is applied, and an output; and a second resistance having a first end which is connected to said negative input of said first operational amplifier, and a second end which is connected to said output of said first operational amplifier.

8. The microphone unit according to claim 7, wherein said amplifier further includes:

a second operational amplifier having a positive input which is connected to said first current electrode of said first transistor, an output which is connected to said first end of said first resistance, and a negative input which is short-circuited with said output.

* * * * *